(12) United States Patent
Tanaka

(10) Patent No.: US 7,405,156 B2
(45) Date of Patent: Jul. 29, 2008

(54) METHOD OF FORMING WIRING PATTERN

(75) Inventor: Hiroaki Tanaka, Kanagawa (JP)

(73) Assignee: NEC LCD Technologies, Ltd., Kawasaki, Kanagawa (JP)

( * ) Notice: Subject to any disclaimer, the term of this patent is extended or adjusted under 35 U.S.C. 154(b) by 266 days.

(21) Appl. No.: 11/174,622

(22) Filed: Jul. 6, 2005

(65) Prior Publication Data

US 2006/0009020 A1   Jan. 12, 2006

(30) Foreign Application Priority Data

Jul. 7, 2004   (JP)   ............... 2004-200685

(51) Int. Cl.
*H01L 21/44*   (2006.01)
(52) U.S. Cl. .................... 438/675; 438/597; 438/618; 438/640; 438/660; 257/E21.476
(58) Field of Classification Search ................. 438/671, 438/675; 257/E21.476
See application file for complete search history.

(56) References Cited

U.S. PATENT DOCUMENTS

| 4,539,507 | A * | 9/1985 | VanSlyke et al. | ............. 313/504 |
| 2005/0196969 | A1 * | 9/2005 | Gunner et al. | ............. 438/725 |

FOREIGN PATENT DOCUMENTS

| JP | 02-188924 | 7/1990 |
| JP | 07-22395 | 1/1995 |
| JP | 2001-35814 | 2/2001 |
| JP | 2003-188497 | 7/2003 |
| JP | 2003-209341 | 7/2003 |

* cited by examiner

*Primary Examiner*—Michael S. Lebentritt
*Assistant Examiner*—Angel Roman
(74) *Attorney, Agent, or Firm*—McGinn IP Law Group PLLC

(57) ABSTRACT

A photoresist pattern is formed on an insulating substrate so that it has a reverse tapered cross section and a reverse pattern of a wiring pattern to be formed. Next, a nanoparticles-containing ink is injected on a wiring region using an inkjet system, followed by a leveling process, a drying process, a resist separation process and a baking process. Thus a wiring pattern is formed.

20 Claims, 5 Drawing Sheets

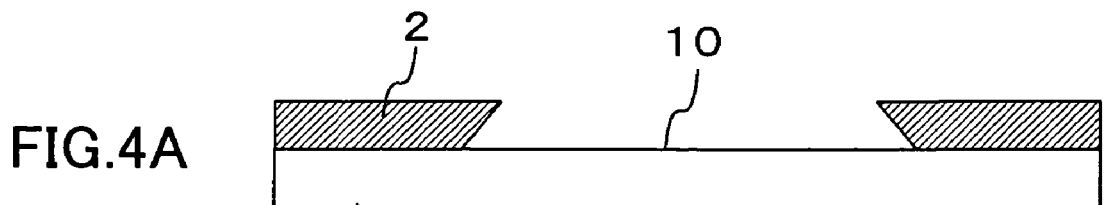
FIG.4A
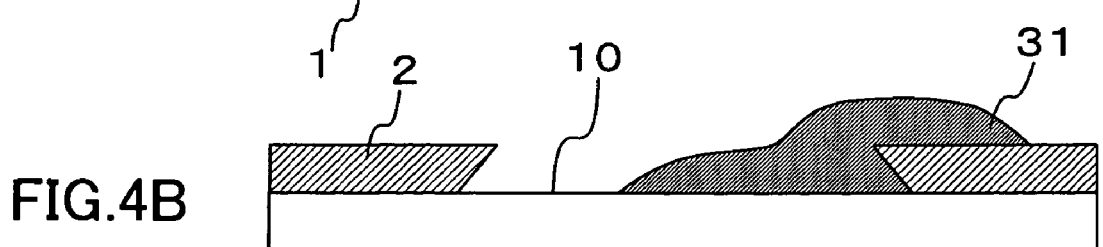
FIG.4B
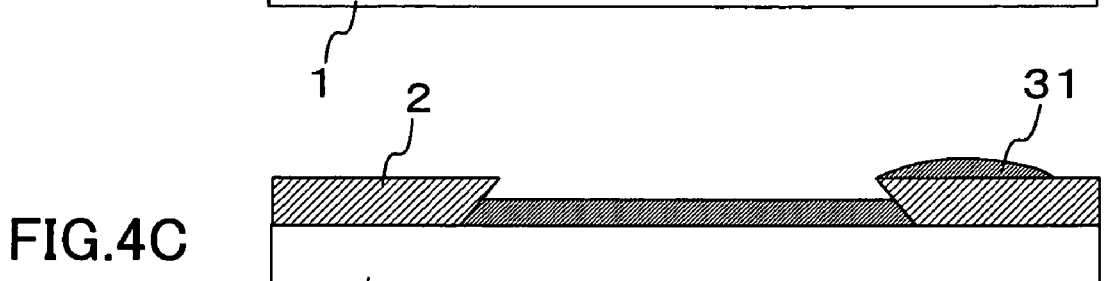
FIG.4C
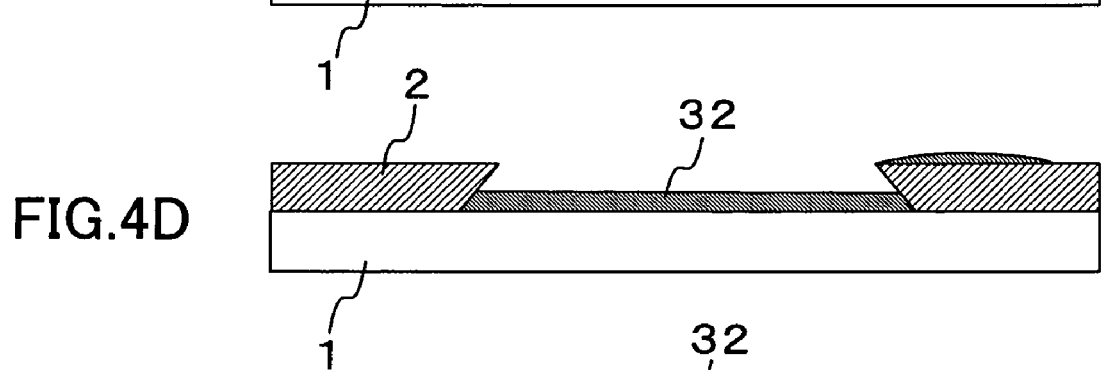
FIG.4D
FIG.4E
FIG.4F
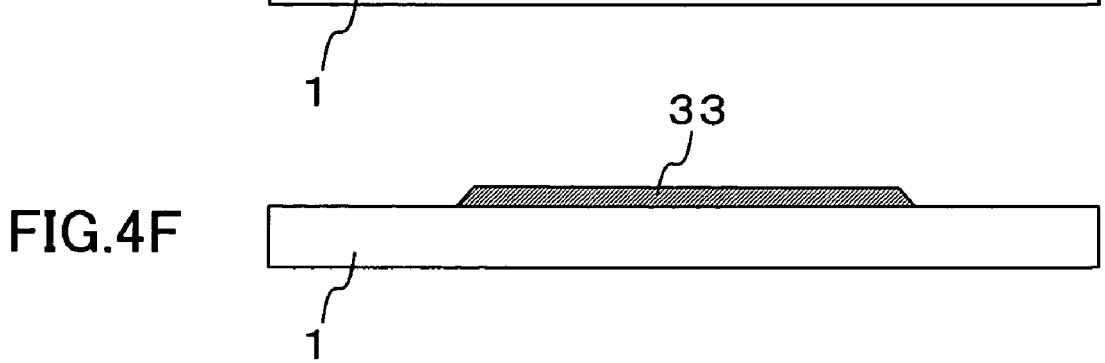

METHOD OF FORMING WIRING PATTERN

BACKGROUND OF THE INVENTION

1. Field of the Invention

The present invention relates to a method of forming a wiring pattern on panel substrates of display devices such as liquid crystal display devices and plasma displays. Specifically, the present invention relates to a method of forming a wiring pattern using inks containing metallic nanoparticles.

2. Description of the Related Art

Conventionally, various processes, that is, a sputtering process, a photolithography process and an etching process are used to form a wiring pattern on substrates that are used for liquid crystal display devices and the like and include thin film transistors (TFTs) arranged in an array.

For example, the sputtering process is the process for adhering a metal film or the like, constituting a wiring pattern, to the substrate, and the photolithography process is the process for forming a predetermined pattern for a wiring pattern. In addition, the etching process is the process for removing unnecessary portions while leaving necessary portions that will constitute the wiring pattern.

When TFTs are intended to be formed on the substrate in this way, the manufacturing cost is increased due to the use of vacuum systems in the sputtering process. As an alternative to the above-described method of forming a wiring pattern, the technique disclosed in Japanese Laid-Open No. 2001-35814 (hereinafter referred to as patent document 1) is known, which is the method of applying a metallic nanoparticles-containing ink onto a substrate. The metal nanoparticles are conductive ultrafine particles (hereinafter referred to as nanoparticles) with particle diameters of the order of nanometer (1 nm=0.001 μm).

FIGS. 1A to 1E are cross-sectional views of principal portions of a substrate, which are shown in order of production process, for explaining the technique of forming a wiring pattern disclosed in Patent document 1. First, an ink 31 containing Ag and Pd nanoparticles is applied on a substrate 1 by a spin coating. The ink 31 applied is then dried to form a thin film 32. Next, as shown in FIG. 1B, an etching process is performed on the thin film 32 in such a way as to only leave necessary portions intact. Thus, a photoresist 2 with an wiring pattern is formed on the thin film 32. Next, as shown in FIG. 1C, using the photoresist 2 as a mask, unnecessary portions of the thin film 32 is removed by etching. And then, as shown in FIG. 1D, the photoresist 2 on the thin film 32 is removed. Subsequently, when the substrate 1 is baked in a furnace as shown in FIG. 1E, the thin film 32 is baked, and a wiring 33 is formed which is composed of a thin film made of an alloy of Ag and Pd.

In the above-described method of forming a wiring pattern disclosed in Patent document 1, an ink material is applied on the entire surface of the substrate, and therefore the manufacturing cost is increased.

Hence, in order to achieve reduction in the manufacturing cost by reducing the amount of nanoparticles-containing inks to be used, an inkjet system is employed that enables local application of inks. However, this inkjet system has poor accuracy in positioning of inks, and is not generally suited for the formation of fine patterns.

In order to solve the conventional problems, Japanese Patent Laid-Open No. 2003-188497 (hereinafter referred to as Patent document 2) discloses a technique in which a water repellent film is formed.

The technique disclosed in Patent Document 2 involves: after forming a water repellent film on a substrate, removing the water repellent film formed on the wiring forming regions by irradiating it with laser beams; and applying, using an ink jet system, a nanoparticles-containing ink onto regions where the water repellent film has been removed.

FIGS. 2A to 2E show cross-sectional views of the principal portions of the substrate, which are shown in order of production process, for explaining the technique of forming a wiring pattern disclosed in Patent document 2. First, a water repellent film 4 such as fluorine resin is formed on the surface of the substrate 1, as shown in FIG. 2A. Next, as shown in FIG. 2B, a laser beam 5 is irradiated on the surface of the substrate 1 in accordance with an wiring pattern to be formed. As a consequence, the portions of the water repellent film 4, irradiated with the laser beam 5, are removed. Thus, the surface of the substrate 1 is exposed. Next, as shown in FIG. 2C, when the exposed surface is roughened, the surface of the substrate 1 is cleaned to remove scrap pieces of the substrate 1, followed by drying of the surface of the substrate 1. Next, as shown in FIG. 2D, using an inkjet system, a jet of the nanoparticles-containing ink 31 is directed at regions where the water repellent film 4 has been removed. In the drawing process in which the ink 31 is injected, an inkjet apparatus equipped with inkjet nozzles is used to direct a jet of the nanoparticles-containing ink at the surface of the substrate 1, and thereby a conductive circuit pattern is formed. The conductive circuit pattern is drawn by driving the XY table according to the wiring pattern to be formed on the substrate 1. Even when the nanoparticles-containing ink 31 lies off the regions where the water repellent film 4 has been removed, the hydrophobic properties of the water repellent film 4 allows the nanoparticles-containing ink 31 to move to the wiring regions. While maintaining this state, the formed pattern is dried. Thereafter, as shown in FIG. 2E, the water repellent film 4 on the substrate 1 is removed by cleaning, and then the substrate 1 is dried. Subsequently, the ink 31 formed on the wiring region is subjected to a baking treatment, whereby a wiring pattern is formed.

In patent document 1 described above, after applying the nanoparticles-containing ink onto the substrate by spin coating, a photolithography process and an etching process are adopted for the formation of a wiring pattern.

For this reason, consumption of materials may be increased when the ink is applied by spin coating, and the ink may be applied on the unnecessary portions of a substrate. Thus, materials are not efficiently used and the manufacturing cost is increased.

In such cases, inkjet systems can be used to apply the nanoparticles-containing ink onto only wiring portions, and thus materials can be used more efficiently. However, conventional inkjet systems have poor accuracy in positioning of inks, and are not suited for the formation of fine wiring patterns. Moreover, in Patent document 2, a water repellent film is formed on the surface of the substrate to form a finer pattern by using an inkjet system in order to relax the accuracy in positioning of the ink. However, in Patent document 2, a laser beam is directly irradiated onto the water repellent film to form a pattern. Accordingly, there is a problem that the shape and thickness of the water repellent film that needs to be removed cannot be controlled accurately. As a result, the shape of a wiring pattern, reflecting the portions of the water repellent film that have been removed, cannot be controlled accurately.

In addition, when multilayered wiring patterns are to be formed, a wiring pattern in the lower layers are damaged by the laser beam, and voids are generated in insulating films provided between the upper and lower layers of a wiring pattern.

SUMMARY OF THE INVENTION

The present invention provides a method of forming, using an ink material containing nanoparticles, a wiring pattern on panel substrates of display devices such as liquid crystal display devices and plasma displays.

The present invention provides a method of forming a fine wiring pattern using an inkjet system in which an ink material containing nanoparticles is used efficiently.

The method of the present invention for forming a wiring pattern includes: partitioning the insulating substrate into wiring regions using a photoresist; and drawing an wiring pattern on the wiring regions by injecting an ink which contains metallic nanoparticles thereon.

In the method of the present invention for forming a wiring pattern, a pattern of the photoresist, formed on the substrate, is formed to have a reverse tapered cross-section in the step of forming wiring regions.

In the method of the present invention for forming a wiring pattern, either a positive photoresist or a negative photoresis can be employed as the photoresist.

In the method of the present invention for forming a wiring pattern, the step of drawing a wiring pattern includes: injecting a jet of a nanoparticles-containing ink on the wiring regions; leveling the ink injected on the wiring region; drying the ink which has been leveled; separating the photoresist from the substrate; and baking the ink on the wiring regions.

In the method of the present invention for forming a wiring pattern, the photoresist may be composed of a layered film in which a plurality of photoresists with different light sensitivities is laminated.

When the layered film is composed of positive photoresists, the layered film is configured to include positive photoresists that are arranged to have increasing sensitivity toward the insulating substrate. Thus, a photoresist pattern can be formed to have a reverse tapered cross section.

Meanwhile, when the layered film is composed of negative photoresists, the layered film is configured to include negative photoresists that are arranged to have decreasing sensitivity toward the insulating substrate. Thus, a photoresist pattern can be formed to have a reverse tapered cross section.

In the method of the present invention for forming a wiring pattern, the photoresist can be formed to have a reverse tapered cross-section.

Thus, it is possible to reduce the influence on the accuracy in positioning of the inks, to form a fine wiring pattern using an inkjet system, and to use an ink material more efficiently.

Furthermore, the method of the present invention for forming a wiring pattern allows the photoresist to have a reverse tapered cross-section, and therefore the wiring pattern can be formed to have forward tapered cross-sections.

In this way it is possible to prevent generation of voids in films provided between layers that are arranged above the layer where the wiring pattern in question are formed. Also, it is possible to prevent breakage of a wiring pattern that are provided in upper layers of the wiring.

BRIEF DESCRIPTION OF THE DRAWINGS

The above and other objects, features and advantages of the present invention will become more apparent from the following detailed description when taken in conjunction with the accompanying drawings wherein:

FIGS. 4A to 4F show cross-sectional views of principal portions of the substrate, taken along the same line as I-I line shown in FIG. 3A and respectively corresponding to the principal portions shown in FIGS. 3A to 3F.

DETAILED DESCRIPTION OF THE PREFERRED EMBODIMENTS

The method of the present invention for forming a wiring pattern includes the steps of: applying a photoresist on an insulating substrate to partition it into wiring regions; and drawing an wiring pattern by injecting a jet of a nanoparticles-containing ink onto the wiring regions.

The photoresist, used to partition the insulating substrate 1 into the wiring regions, is formed to have a reverse tapered cross section. As a consequence, the a wiring pattern, formed of a nanoparticles-containing ink, are formed to have forward tapered cross-sections.

The method of the present invention for forming a wiring pattern is described in detail on the basis of typical embodiments below.

Exemplary Typical Embodiment 1

Figure 1A:
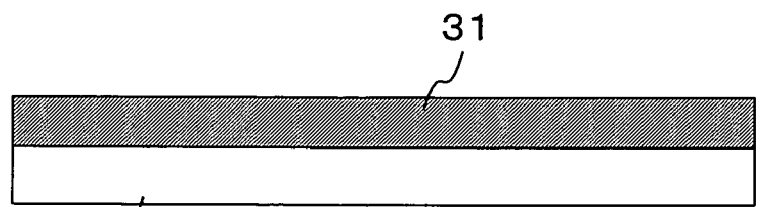
FIGS. 1A to 1E are cross-sectional views of principal portions of a substrate, which are shown in order of production process, for explaining one example of a conventional method of forming a wiring pattern.
Figure 1B:
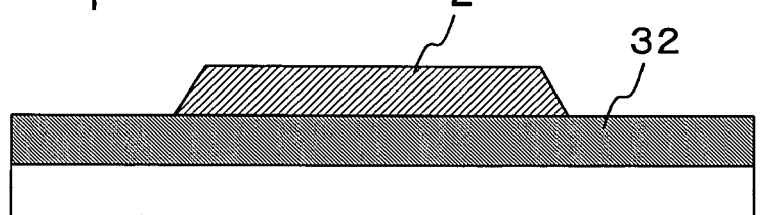
Figure 1C:
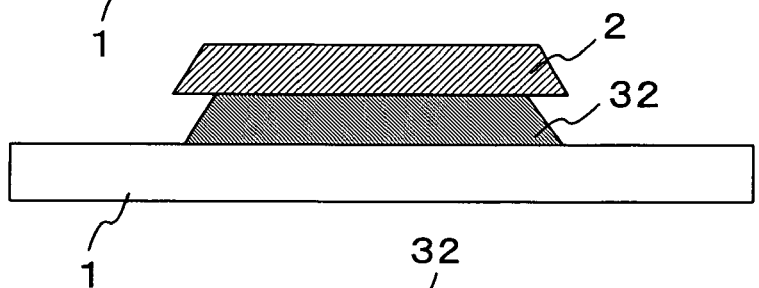
Figure 1D:
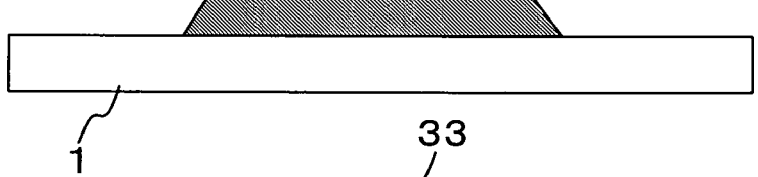
Figure 1E:
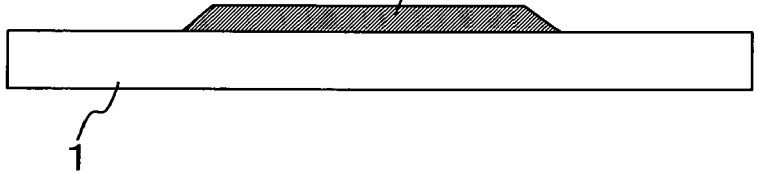
Figure 2A:
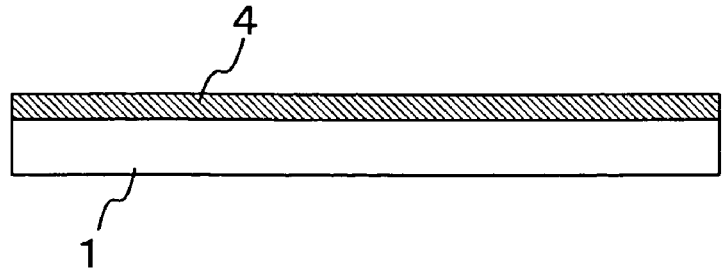
FIGS. 2A to 2E show cross-sectional views of principal portions of a substrate, which are shown in order of production process, for explaining another example of a conventional method of forming a wiring pattern.
Figure 2B:
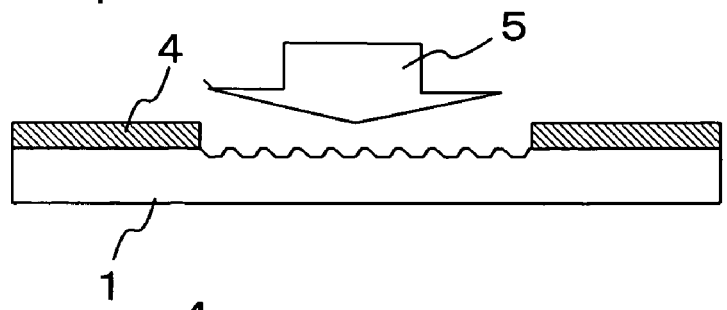
Figure 2C:
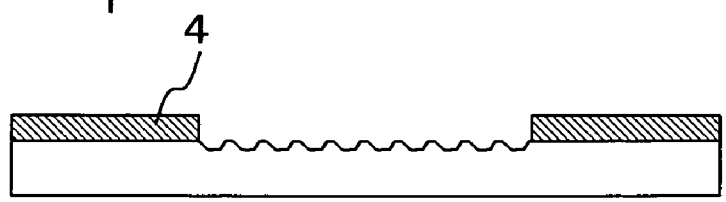
Figure 2D:
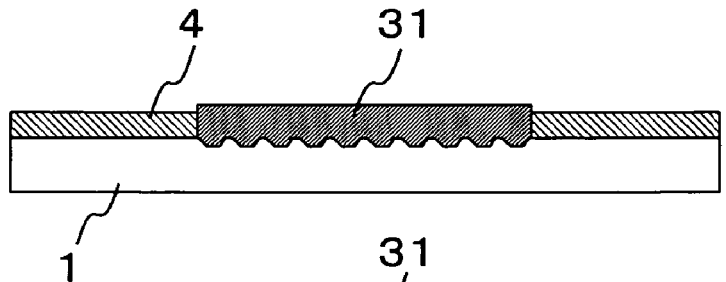
Figure 2E:
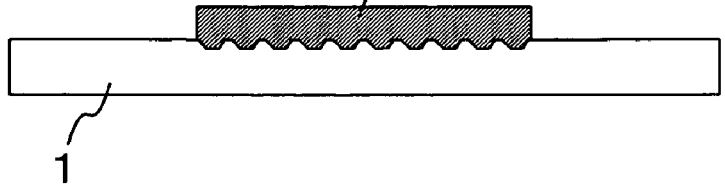
Figure 3A:
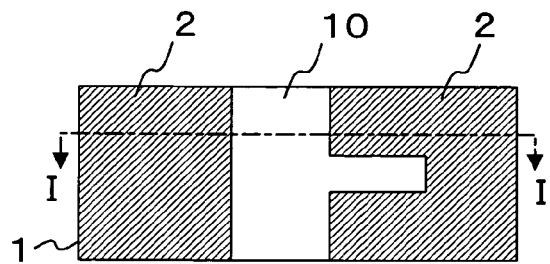
FIGS. 3A to 3F show plan views of principal portions of a substrate, which are shown in order of production process, for explaining a typical first embodiment of the method of the present invention for forming a wiring pattern.

Hereinafter, a first embodiment of the present invention will be described with reference to the drawings, in which the formation of a gate wiring on a panel substrate of a liquid crystal display device is taken as an example. First, as shown in FIGS. 3A and 4A, a photoresist 2 having a pattern as shown is formed on an insulating substrate 1 such as a glass substrate to partition it into an wiring region 10 for a gate wiring. This process is the first step of forming a wiring pattern, and is a lithography process through which the wiring region 10 is formed on the insulating substrate 1, the entire surface of which has been coated with the photoresist 2, by irradiating it with light or laser beams.

The photolithography process includes an application step of applying the photoresist 2 onto the entire surface of the substrate 1, an exposure step of exposing the photoresist 2, corresponding to regions other than the wiring region 10, to light, and a development step.

A negative photoresist is used for the photoresist 2, and is formed on the insulating substrate 1 in a thickness of 5 to 10 μm. After the exposure step, the portions of the negative photoresist, corresponding to the wiring region 10 (i.e., the portions where light or the like has not been applied), are removed in a developer. In other words, the photoresist formed in the wiring regions completely dissolved into the developer. Here, the surface of the photoresist is hardened widely by strong light, whereas a photoresist near the surface of the insulating substrate 1, where light cannot reach readily, is hardened more narrowly compared with the surface of the photoresist. For this reason, the photoresist 2 left on the insulating substrate 1 has a reverse tapered cross-section. As a result, a wiring pattern can be formed to have forward tapered cross-sections in the final process.

Figure 3D:
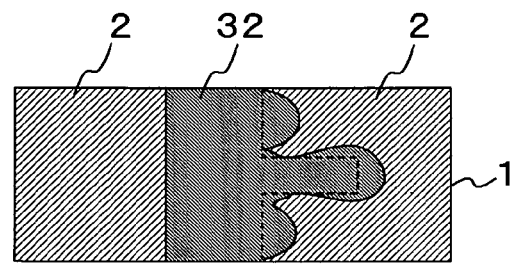
Figure 3B:
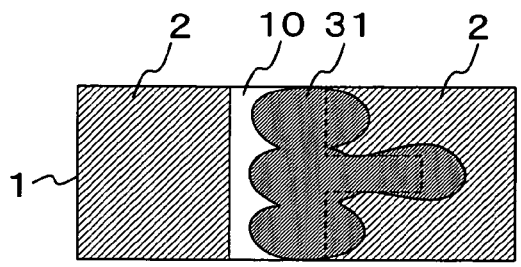

Next, as shown in FIGS. 3B and 4B, an ink 31 containing aluminum nanoparticles with an average particle diameter of 1 to 100 nm is applied on the wiring region 10 as an wiring material for gate a wiring pattern. Here, the ink 31 is applied so that its thickness is in a range of 3 to 5 µm after dried.

This process is the ink injection process, which is the second step for the formation of a wiring pattern. In this process, using an inkjet system, a jet of the ink 31 containing predetermined nanoparticles is directed onto the wiring regions 10. The use of the inkjet system prevents the nanoparticles-containing ink 31 from being applied to unnecessary portions, and therefore materials can be used efficiently. In this way it is possible to achieve reduction in the manufacturing cost of a wiring pattern.

Moreover, at the same time, the photoresist 2 left on the inslulation substrate 1 serves as a frame for preventing the ink 31 from draining away. Thus, the accuracy in positioning of the ink may be not concerned. Note that, in addition to the nanoparticles described above, nanoparticles made of any one of Au, Ag, Cu, Pt, Pd and Ni, or nanoparticles made of an alloy of two or more types of metals selected from Au, Ag, Cu, Pt, Pd, Ni and Al can be used. A nanoparticles-containing ink 31 should have a viscosity of 5 to 30 mPa·S at 20° C.

Figure 3E:
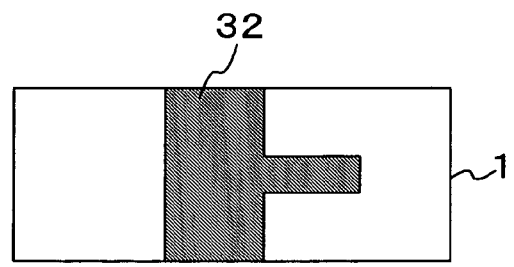
Figure 3C:
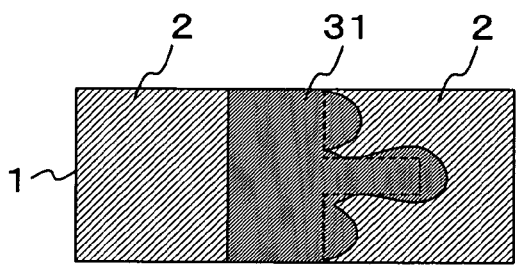

Next, as shown in FIGS. 3C and 4C, the ink 31 is leveled. This process is the third step for the formation of a wiring pattern, a leveling process for smoothing the surface of the nanoparticles-containing ink 31 present in the wiring region 10. The process is performed in order to pour the nanoparticles-containing ink 31 into portions where the ink 31 has not been applied even by inkjet. Various methods can be adopted for the leveling process, and one example involves keeping the substrate at rest in a horizontal position over a predetermined period of time under the atmosphere.

Next, as shown in FIGS. 3D and 4D, the ink 31 is dried. Reference numeral 32 denotes the ink after it has been dried. This process is an ink-drying process, the fourth step for the formation of a wiring pattern. In this process, a solvent in the nanoparticles-containing ink 31 present in the wiring region 10 is removed. The removal of the solvent can be achieved simply by allowing the substrate to stand in the air at room temperature. Alternatively, heating means may be used.

Next, as shown in FIGS. 3E and 4E, the photoresist 2 on the insulating substrate 1 is removed. This process, the fifth process for the formation of a wiring pattern, is a resist separation process for removing the photoresist 2 on the insulating substrate 1 and the unnecessary, dried ink 32 on the photoresist 2 while leaving the dried ink 32 on the wiring regions 10. In this resist separation process, organic solvents are used to separate the photoresist.

Figure 3F:
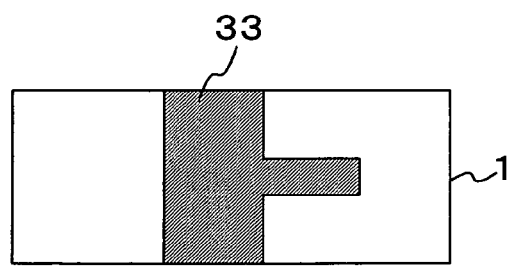

Next, as shown in FIGS. 3F and 4F, the dried ink 32 is baked to form an wiring pattern 33 (gate wiring). This process, the sixth step for the formation of a wiring pattern, involves placing the insulating substrate 1 into a furnace and baking the dried ink 32 at 500° C. or less, preferably at 150 to 350° C. Thus, the wiring pattern 33 is formed.

In this embodiment, the photoresist 2 having a reverse tapered cross section is formed on the insulating substrate 1 to serve as a frame, as described above. A jet of the nanoparticles-containing ink 31 is applied and coated on the insulating substrate 1 by the inkjet system. For this reason, materials can be used more efficiently, and the influence on the accuracy in positioning of the ink by inkjet can be reduced.

In addition, the photoresist 2 is formed to have a reverse tapered cross-section, which in turn makes it possible to allow a wiring pattern to be formed in forward tapered shapes. The forward tapered shapes of a wiring pattern can reduce voids (defects) generated in films provided between layers that are arranged above the layer where the wiring pattern in question are formed. Thus, it is possible to prevent breakage of a wiring pattern that are provided above the layer where the wiring pattern in question are formed.

In the example mentioned above, a photoresist with a single layer has been used. However, a photoresist with two or more layers can be formed. In this case, either a negative photoresist or a positive photoresist may be used.

An example in which a positive photoresist is used is described below.

Exemplary Typical Embodiment 2

Figure 5:
FIG. 5 shows a cross-sectional view of principal portion of a substrate for explaining a typical second embodiment of the method of the present invention for forming a wiring pattern.

Next, a second embodiment of the method of the present invention for forming a wiring pattern will be described with reference to FIG. 5, in which the formation of a gate wiring on a panel substrate of a liquid crystal display device is taken as an example. In this embodiment, as shown in FIG. 5, only the cross-sectional views of a substrate 1 and a photoresist are shown, which are equivalent to those shown in FIG. 4A, described in the first embodiment. Because the cross-sectional views of the substrate 1, a photoresist formed thereon, and an wiring formed of an ink are similar to those described in FIGS. 4B to 4F, they are not illustrated in FIG. 5.

In the first embodiment, a negative photoresist with a reverse tapered cross section is used as the photoresist applied on the insulating substrate 1 in the photolithography process as the first step. In this embodiment, instead of using this negative photoresist, a positive photoresist is used. Specifically, in this embodiment, a high-sensitive positive photoresist 2A is applied on the entire surface of the insulating substrate 1 at the first place in the photolithography process as the first step, and then a low-sensitive positive photoresist 2B is applied thereon. The total thickness of the photoresists 2A and 2B is set to about 10 µm. In this state, the wiring regions 10 are exposed to light. These photoresists 2A and 2B form a two-layered positive photoresist 2C. The layered positive photoresist 2C is a photosoluble resist, and the portions irradiated with light are removed in a developer.

To sum up, in the nagative photoresist of the first embodiment resist regions other than the pattern which constitutes the a wiring pattern are irradiated with light, whereas in this positive photoresist 2C only pattern regions constituting a wiring pattern are required to be irradiated with light.

Moreover, the reason why the high-sensitive positive photoresist 2A is provided immediately above the substrate in this embodiment, is to allow the entire photoresist to have a reverse tapered cross-section. The structure of this layered photoresist is not limited to a two-layered structure, and the layered photoresist may be formed of a plurality of layers, that is, three or more layers. In other words, any number of positive photoresists may be laminated to form a layered photoresist as long as it has a structure in which a positive photoresist with the highest sensitivity is provided at the position closest to the substrate and positive photoresists are arranged in the order of decreasing sensitivity toward upper layers. Also in this embodiment, the inkjet system is employed in the ink injection process which is followed by the photolithography process. In this way materials can be further used efficiently, which reduces the manufacturing cost. Furthermore, the two-layered photoresist is formed to have a reverse tapered cross section to serve as a frame.

Thus, it is possible to form a fine pattern by reducing the influence on the accuracy in positioning of the ink by inkjet, and to allow a wiring pattern to have forward tapered cross-sections.

In the second embodiment described above, a two-layered positive photoresist has been adopted for a photoresist. However, the same effect will be realized by using a two-layered negative photoresist. In such a case, a low-sensitive negative photoresist is applied on the entire surface of a substrate, and then a high-sensitive negative photoresist is applied thereon. Specifically, when a layered negative photoresist is used, photoresist portions corresponding to regions other than wiring regions 10 are irradiated with light. Here, the photoresist provided in the upper layer is a high-sensitive resist and therefore hardened so that the wiring regions become large, and the photoresist provided in the lower layer is a low-sensitive photoresist and therefore hardened so that the wiring regions become small. Thus, the entire negative photoresist is formed to have a reverse tapered cross-section in a developing step. Also when the two-layered negative photoresist is used, the same effect as that realized by the two-layered positive photoresist can be realized.

While this invention has been described in connection with certain preferred embodiments, it is to be understood that the subject matter encompassed by way of this invention is not to be limited to those specific embodiments.

On the contrary, it is intended for the subject matter of the invention to include all alternative, modification and equivalents as can be included within the spirit and scope of the following claims.

What is claimed is:

1. A method of forming a wiring pattern on an insulating substrate using a nanoparticles-containing ink, comprising:
   partitioning the insulating substrate into wiring regions using a photoresist film; and
   drawing the wiring pattern on the insulating substrate by injecting the ink thereon, the ink comprising metallic nanoparticles,
   wherein patterns of the photoresist film which partition the insulating substrate into the wiring regions comprise a reverse tapered cross section, and
   wherein said drawing of said wiring pattern comprises leveling the ink formed on the wiring regions.

2. The method according to claim 1, wherein the metallic nanoparticles are injected on the wiring regions by an inkjet system.

3. The method according to claim 1, wherein the photoresist film comprises a negative photoresist.

4. The method according to claim 1, wherein said drawing of said wiring pattern further comprises:
   injecting a jet of the ink on the wiring regions;
   drying the ink which has been leveled;
   separating the photoresist film from the substrate; and
   baking the ink on the wiring region.

5. The method according to claim 4, wherein the ink is injected onto a surface of the insulating substrate before the photoresist film is removed.

6. The method according to claim 1, wherein the leveling comprises maintaining the insulating substrate at rest in a horizontal position over a predetermined time.

7. The method according to claim 4, wherein the drying comprises removing a solvent from the ink.

8. The method according to claim 4, wherein separating the photoresist film from the substrate comprises applying organic solvents to the photoresist film.

9. The method according to claim 4, wherein baking comprises beating the ink at a temperature in a range from about 150° C. to 350° C.

10. The method according to claim 4, wherein said injecting comprises drawing the wiring pattern on a surface of the insulating substrate.

11. The method according to claim 1, wherein the photoresist film comprises a layered film of at least two photoresists with different light sensitivities.

12. The method according to claim 11, wherein the layered film comprises a positive photoresist, and
   wherein a plurality of photoresist films are arranged in an order of increasing sensitivity toward the insulating substrate.

13. The method according to claim 11, wherein the layered film comprises a negative photoresist, and
   wherein a plurality of photoresist films are arranged in an order of decreasing sensitivity toward the insulating substrate.

14. The method according to claim 1, wherein the metallic nanoparticles comprise an average particle diameter of 1 to 100 μm.

15. The method according to claim 1, wherein the metallic nanoparticles comprise at least one of Au, Ag, Cu, Pt, Pd, Ni and Al.

16. The method according to claim 1, wherein the insulating substrate is partitioned into wiring regions by depositing the photoresist film onto a surface of the insulating substrate.

17. The method according to claim 1, wherein the wiring pattern is drawn on a surface of the insulating substrate.

18. The method according to claim 1, wherein the photoresist film is deposited at a thickness of 5 μm to 10 μm.

19. The method according to claim 1, wherein the ink has a viscosity of 5 to 30 mPa·S at 20° C.

20. A method of forming a wiring on an insulating substrate, comprising:
   partitioning a surface of the insulating substrate into wiring regions using a photoresist film forming a reverse tapered cross section;
   injecting an ink comprising nanoparticles on the wiring region using an ink-jet process;
   leveling the ink formed on the wiring region;
   drying the ink which has been leveled;
   separating the photoresist film from the substrate; and
   baking the ink on the wiring region.

* * * * *